United States Patent

[11] 3,615,956

[72] Inventors Stephen M. Irving
Cupertino;
Kyle Eugene Lemons, San Jose; George E. Bobos, Santa Clara, all of Calif.

[21] Appl. No. 810,997
[22] Filed Mar. 27, 1969
[45] Patented Oct. 26, 1971
[73] Assignee Signetics Corporation
Sunnyvale, Calif.

[54] GAS PLASMA VAPOR ETCHING PROCESS
19 Claims, 3 Drawing Figs.

[52] U.S. Cl. .......... 156/17, 204/193, 29/580, 148/1.5
[51] Int. Cl. .......... H01l 7/44, H01l 7/50, H05k 3/06
[50] Field of Search .......... 156/17; 204/177, 193; 29/580; 148/1.5

[56] References Cited
UNITED STATES PATENTS

| | | | |
|---|---|---|---|
| 3,309,302 | 4/1967 | Heil .......... | 204/192 |
| 3,410,776 | 11/1968 | Bersin .......... | 204/193 |
| 3,442,701 | 5/1969 | Lepselter .......... | 117/212 |

*Primary Examiner*—Jacob H. Steinberg
*Attorney*—Flehr, Hohbach, Test, Albritton & Herbert

ABSTRACT: Gas plasma vapor etching process utilized for removing portions of material from a semiconductor structure for a number of purposes including polishing and cleaning of the silicon wafers, finding pin holes in an insulating layer covering the semiconductor wafer and forming scribe lines in the wafer to thereafter permit the wafer to be mechanically broken into dice without any substantial damage to the dice.

PATENTED OCT 26 1971 3,615,956

INVENTOR.
Stephen M. Irving
Kyle E. Lemons
George E. Bobos
BY Flehr, Hohbach, Test, Albritton & Herbert
Attorneys

GAS PLASMA VAPOR ETCHING PROCESS

BACKGROUND OF THE INVENTION

In dicing silicon wafers, it has been common to utilize a diamond point for forming scribe lines on the wafers between the individual circuit chips or dice. Generally this has been accomplished by forming a plurality of scribe lines in one direction and then forming additional scribe lines at an angle of 90° with respect to the first named scribe lines to form small rectangles or squares. After the scribe lines have been formed, the wafer is mechanically stressed which causes the wafer to break apart along the scribe lines. It has been found that this mechanical scribing of the wafers may cause cracks to propagate into the individual die or a circuit to thereby greatly reduce the yield of usable circuits from the wafer. Such practices are presently being used with wafers which are approximately one and a half inches in diameter and have a thickness of 7 to 8 mils. At the present time, there is a need to utilize larger diameter wafers and with a greater thickness, as for example, two inches in diameter and a thickness of 10 mils or greater. Utilizing wafers of this greater size and thickness makes mechanical scribing more difficult and also greatly increases the loss of yield. There is, therefore, a great need for a new and improved method for scribing wafers.

SUMMARY OF THE INVENTION AND OBJECTS

The gas plasma vapor etching process is utilized for performing operations on semiconductor wafers by exposing the semiconductor wafers to a nonequilibrium low temperature plasma to remove portions of material carried by the semiconductor structure. In one embodiment of the method, the surface portions of the semiconductor material can be removed by the gas plasma to clean or polish the surface of the semiconductor wafer. In another embodiment of the process, the semiconductor wafer having an insulating coating formed thereon can be exposed to the gas plasma to determine whether or not there are any pin holes in the insulating layer. This can be ascertained by finding whether or not the gas has been able to attack the surface of the semiconductor wafer below the insulating layer. In still another embodiment, the gas plasma is utilized for forming scribe lines in the wafer without damaging the circuit elements carried by the dice and which thereafter greatly facilitates mechanical separation. The scribe lines can be formed prior to or after metallization.

In general, it is an object of the present invention to provide a gas plasma vapor etching process which is particularly useful for performing operations on semiconductor wafers.

Another object of the invention is to provide a process of the above character which can be utilized for cleaning the surface of a wafer.

Another object of the invention is to provide a process of the above character which can be utilized for determining whether or not pin holes are present in insulating layer covering a semiconductor wafer.

Another object of the invention is to provide a process of the above character which can be utilized for forming scribe lines in a wafer.

Additional objects and features of the invention will appear from the following description in which the preferred embodiments are set forth in conjunction with the accompanying drawing.

DESCRIPTION OF THE PREFERRED EMBODIMENT

Figure 1:
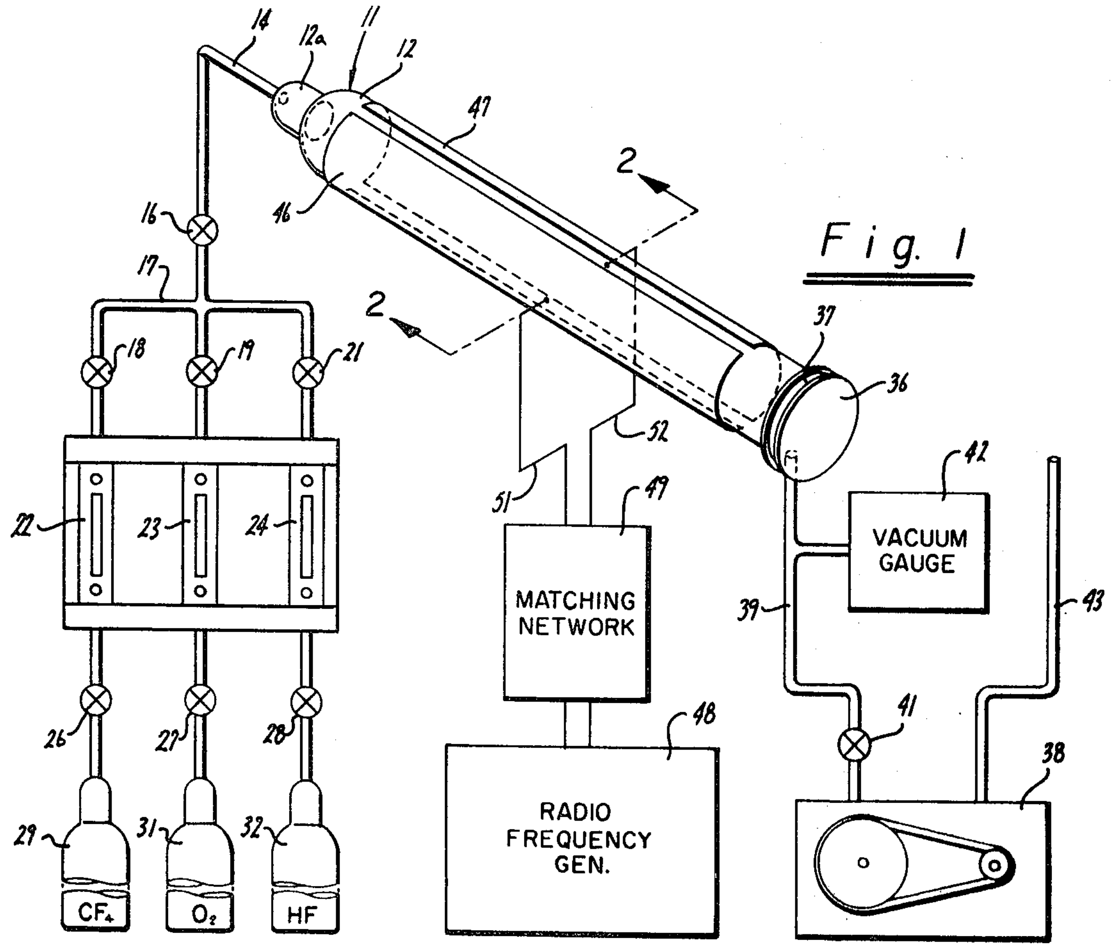
FIG. 1 shows a radio frequency plasma apparatus and system which is utilized in performing the process incorporating the present invention.

A radio frequency plasma apparatus and system is shown in the drawing which can be utilized in performing the process of the present invention. The apparatus and system consists of a relatively large elongate reaction vessel 11 of a suitable type. For example, it can consist of the quartz tube 12 which is approximately 3 inches in diameter and 4 feet in length. The tube 12 is formed so as to provide therein a cylindrical reaction zone or chamber 13. One end of the tube is provided with a necked-down portion **12*a* which serves as a gas inlet to the tube 12. A pipe 14 of a suitable material such as stainless steel is connected to the gas inlet portion 12*a* and has a control valve 16 mounted therein. The valve 16 is connected to a manifold 17 which has a plurality of valves 18, 19 and 21 connected therein and which are connected to flow meters 22, 23 and 24 respectively. The flow meters 22, 23 and 24 are connected through valves 26, 27 and 28 to suitable sources of gas indicated by bottles 29, 31 and 32**. These bottles contain any suitable gases which are required for the processing operations. By way of example, they can contain $CF_4$, $O_2$ and HF as shown in the drawing.

As also shown in the drawing, the other end of the tube 12 is open to permit ready unloading and loading of the tube. The open end of the tube 12 is closed by a flat plate 36 which carries an 0 ring 37. Means is provided for continuously evacuating the chamber 13 within the tube 12 and consists of a mechanical roughing pump which is connected to the tube 12 by a line 39 which has a valve 41 therein. A vacuum gauge 42 is connected into the line 39 and measures the vacuum in the chamber 13. Typically the pressure within the chamber 13 should be within the one-half to 10 millimeters of mercury. The vacuum pump 38 is provided with an exhaust line 43 which can exhaust into a hood or into the open air.

Means is provided for creating an RF field within the reaction zone 13 and consists of a pair of elongate substantially semicircular plates 46 and 47 formed of a suitable conducting metal such as copper. As can be seen from the drawing, the plates have a length which is substantially as great as the length of the tube 12 but are insulated from each other by the quartz tube 12. Radio frequency power is supplied to the two spaced plates 46 and 47 from a radio frequency generator 48 through a matching network 49 through lines 51 and 52 to the plates 46 and 47. The radio frequency generator can be of any suitable type such as one which has a 300 watt maximum output and generates a fixed radio frequency such as 13 and ½ megacycles. The matching network 49 also can be of a conventional type and serves to match the plates 46 and 47 which serve as electrodes to the radio frequency generator or power supply 48 to thereby obtain a maximum transfer of energy from the generator 48 to the gas within the reaction zone 13.

Figure 3:
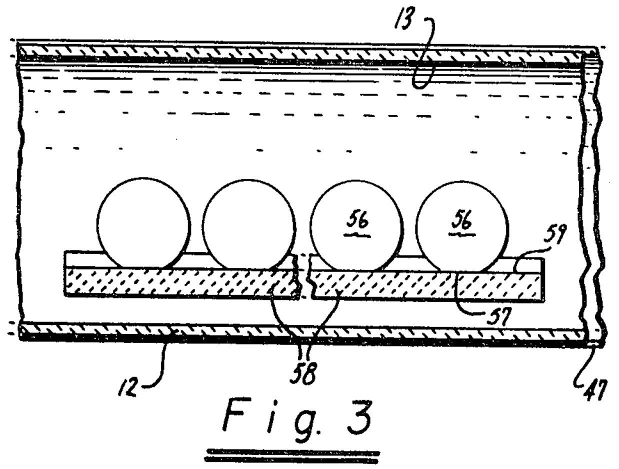
FIG. 3 is a cross-sectional view taken along the line 3—3 of FIG. 2.
Figure 2:
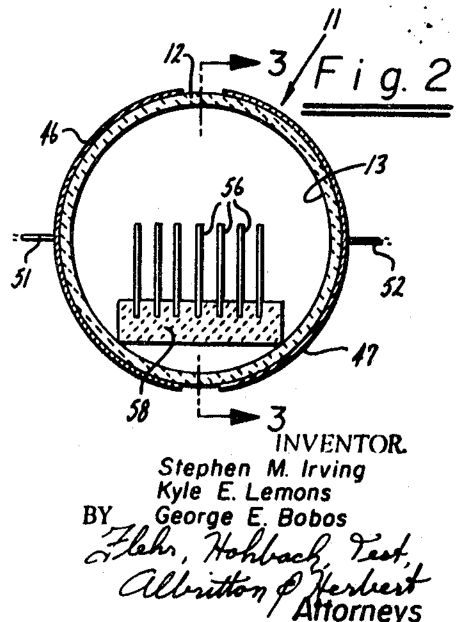
FIG. 2 is a cross-sectional view taken along the line 2—2 of FIG. 1.

In accordance with the present invention, the apparatus and system shown in FIG. 1–3 of the drawing is to be utilized for the processing of semiconductor wafers 56. Typically, as shown in the drawings, such wafers are approximately one and one-half inches in diameter and are provided with a flat 57 to facilitate their handling. Typically, the wafers are mounted in a boat 58 formed of a suitable material such as quartz. The boat 58 is provided with a plurality of spaced parallel slots 59 extending longitudinally of the boat, each of which is adapted to receive a plurality of the wafers 56 as shown in FIG. 3.

In describing the process, let it be assumed that the wafers are formed of a suitable semiconductor material such as silicon and that the wafer has been covered with a layer of insulating material such as silicon dioxide and that it is desired to check to determine whether or not there are any pin holes in the silicon dioxide. The wafers to be checked are loaded into a boat 58 which is placed in the reaction zone 13. The apparatus is then turned on. A gas of a suitable type i.e. one containing chlorine is bled into the reaction zone 13 at a controlled rate. As this gas passes into the field created by the plates 46 and 47, the radio frequency energy excites the gas and initiates a breakdown in the gas which causes energy to be coupled into the gas and to create what is called a glow discharge. It is believed that this glow discharge is comprised of a complicated nonequilibrium low temperature plasma which is highly reactive because it consists of atoms and molecules both neutral and ionized, in ground and excited states which are capable of contributing to a reaction process. In any event, the gas contains active species of atoms and molecules which cause a gas-solid or gas-nongas reaction with any silicon which is exposed through the insulating layer of silicon dioxide. It is believed that the active species or excited molecules of the plasma created by the radio frequency discharge react with the silicon to form a volatile silicon halide compound such as silicon tetrafluoride or silicon tetrachloride which is exhausted by the roughing pump 38.

When the wafer 56 has been exposed to the plasma for a suitable period of time as for example 3 to 10 minutes, the wafers can be removed and checked to determine whether or not there are pin holes in the oxide. This can be determined readily because pits will be formed in the surface of the silicon wafer wherever there are pin holes in the oxide.

Another simple application of the process would be to load the semiconductor wafers 56 in the boats 58 before they have been processed for the purpose of further polishing the surfaces of the wafers. A fluorine or chlorine containing gas would be bled into the chamber 13 which would again cause the gas solid reaction hereinbefore described to slowly remove a portion of the surface of the semiconductor wafer. The process would be carried out so that the reaction would be relatively slow so as to provide a highly polished surface for the semiconductor wafer while at the same time removing any surface contamination.

Still another embodiment of the process is one which can be utilized for forming scribe lines in the wafer. Typically, this would be accomplished immediately after metallization and prior to the fifth masking operation in the formation of integrated circuits. Prior thereto all of the diffusion steps have been completed to provide a plurality of circuit elements which will be utilized to form a semiconductor structure and typically an integrated circuit in each die which is to be formed from the semiconductor wafer. When this is the case, the active and passive devices which make up the circuit elements have generally been formed in accordance with the conventional planar technology in which the PN junctions which make up the devices extend to the surface and in which a layer of silicon dioxide overlies the junctions. Windows or holes have been formed in the oxide so that contact can be made to the regions which make up the active and passive devices. A layer of metallization is then deposited over the surface of the silicon dioxide insulating layer and into the windows. Typically, such metallization would consist of thin aluminum film.

After the metallization has been deposited on the surface, a layer of photoresist is formed on the metallization and then utilizing a mask containing the scribe lines, the photoresist is exposed through the mask and developed so that the aluminum is exposed along the lines where the scribe lines are to be formed. Typically, the scribe lines can have a width of one mil. The metallization which is aluminum and which is exposed through the photoresist can then be removed in any suitable manner. For example, a wet chemical etch such as sodium hydroxide may be used. Alternatively, if desired, the aluminum can be removed by the utilization of a plasma. When this is the case, the semiconductor wafers 56 carrying the metallization would be loaded into the boat 58. A suitable gas such as chlorine would be bled into the reaction zone 13 to cause a gas plasma to be formed in which the active species of the molecules and atoms would attack the aluminum exposed through the photoresist and cause the formation of a volatile chloride of aluminum which would be evacuated through the roughing pump. As soon as the aluminum has been removed either by the wet chemical etching process or by the plasma process to expose the silicon dioxide insulating layer, the chamber 13 would be purged and a new gas metered into the chamber 13. During the vapor etching of the aluminum, the photoresist which would be KTFR would serve as a mask for the aluminum.

Any number of gases can be utilized for etching the silicon dioxide and also the silicon to form the scribe lines of the wafer. A number of fluorine compounds are particularly suitable. For example 20 percent fluorine and argon gas can be utilized. One hundred percent fluorine can also be utilized if it is handled carefully. HF gas can also be used. Carbon tetrafluoride is also useful for this purpose and is particularly attractive for this process because it is easily handled and is not as dangerous as fluorine and HF gases. Although gases are very convenient to use, it is possible to utilize solid sources for the gas. For example, ammonium bifluoride can be utilized by heating a mass of the same upstream from the wafers and utilizing an external heat source such as a heat lamp to heat the mass and to drive off vapors which can be carried downstream by a carrier gas introduced into the chamber 13. The carrier gas can be argon, oxygen, hydrogen, etc. Teflon also is a suitable solid source for fluorine.

As described previously, the formation of the plasma within the reaction zone causes a gas solid reaction which in the case of silicon dioxide causes silicon tetrafluoride to be formed and in the case of silicon causes silicon tetrafluoride to be formed, both of which are volatiles and which are removed by the roughing pump 38.

The reaction within the reaction within the reaction zone 13 should be carried out for a sufficient length of time so that scribe lines of a sufficient depth are formed in the semiconductor wafer. Generally it is desirable that the scribe lines penetrate to a depth which is below the depth of any junction in the semiconductor wafer so as to obtain a high yield. When the wafers are approximately 1 and ½ inches in thickness, they typically have thickness of approximately seven mils or approximately 175 microns. In such a semiconductor wafer, the active areas of the semiconductor devices are located within the upper 25 to 50 microns of the semiconductor wafer and therefore are generally within the upper 25 percent of the wafer. For this reason, it is desirable that the scribe lines penetrate the wafer to a depth of at least 25 percent of the thickness of the wafer and preferably to a depth approaching 50 percent of the thickness of the wafer.

It has been found that scribe lines to this depth can be etched rather rapidly with the present process. For example, scribe lines can be readily etched to this depth within 3 to 10 minutes. Etch rates vary from gas to gas and are dependent on the reactor geometry. Etch rates of 15–20 microns per minute are easily obtainable with the proper choice of a gas and reactor geometry. The etching of the scribe lines will in effect form a moat around each die which is to be made from the semiconductor wafer.

From the foregoing it can be seen that when vapor etching is utilized for etching the aluminum and also for etching the scribe lines in the silicon dioxide and the silicon that both vapor etching steps can be carried out one after the other while the semiconductor wafers are in situ which greatly expedites the process.

After the scribe lines have been etched to a sufficient depth, the semiconductor wafers are removed from the chamber 13. Thereafter, the photoresist remaining is stripped in a conventional manner and a new layer of photoresist is applied which is then exposed through what is conventionally called a fifth mask, i.e., the mask which carries the interconnect pattern which is to be formed by the metallization. The photoresist is then exposed and developed and thereafter, the undesired portions of the metallization are removed by a suitable chemical etch or can be removed by a gas etch in a manner hereinbefore described to provide the desired interconnect pattern on each die. After this has been accomplished, the wafer can be mechanically stressed at which time it will break along the scribe lines which have been formed to provide hundreds of individual dice. The yield of satisfactory semiconductor devices is not decreased by the breaking up on the semiconductor wafer into the dice because there are no cracks formed which propagate into the individual die to destroy the same. This is particularly true because the scribe lines have been formed in such a manner that there are no small cracks made in the wafer during the scribing operation. Even if a crack should form during the time that the wafer is mechanically stressed, such cracks will be below the active regions of the devices and therefore will not effect the actual devices. This is particularly true because if there are any cracks formed, they will have a tendency to propagate toward the bottom of the wafer rather than toward the top of the wafer which has already been scribed.

It should be pointed out that the channels or moats which are formed by the vapor etching process herein described can be formed at any appropriate time in the wafer fabrication process. For example the scribe lines could be formed before the fourth conventional masking operation which is utilized for forming the windows in the silicon dioxide to make contact to the active regions of the devices. In such a case, a layer of photoresist could be applied and exposed through a mask containing the grid of scribe lines and then developed to expose the layer of silicon dioxide. The exposed silicon dioxide could then be removed by fluorine containing gas down to the silicon. The fluorine gas would then be swept out of the tube and a chlorine gas would be introduced which would etch away the silicon without harming the silicon dioxide. The silicon dioxide covered with the photoresist would serve as a mask for the silicon.

After the scribe lines have been formed, the remaining operations to complete the semiconductor devices could be performed after which the wafer would again be mechanically flexed to cause the same to be broken into a plurality of dice along the scribe lines.

The process is particularly advantageous in that is is possible to carry it out at relatively low temperatures so that there is no significant movement of the diffused junctions. Thus the process does not affect the electrical characteristics of the active and passive devices nor does it degrade the semiconductor substrate. In operation of the apparatus, it is believed that the temperature of the semiconductor wafers rarely rises above 150° C. without external heating. This is in contrast to other methods of vapor etching where thermal energy is needed to cause the formation of volatile halides. These temperatures are typically between 800° and 110° C. If desired external heating can be utilized. However, care should be taken so that the temperature does not rise high enough to cause undesirable effects such as shifting of the junctions.

Typically this should not be a temperature over 500° C. for a period exceeding 10 minutes.

From the foregoing it can be seen that the plasma created by the radio frequency discharge in gases can be utilized for forming certain repetitive processing steps in the manufacture of semiconductor devices. In particular the process can be utilized for etching silicon and silicon dioxide and in particular in a delineated pattern by the formation of volatile silicon compounds which are easily removable.

We claim:

1. In a process for performing operations a wafer formed of a semiconductor material and having a surface capable of carrying at least one layer of at least one different material on the surface and disposed in chamber having a pressure ranging from one-half to 10 millimeters of mercury, creating within the chamber of a gas plasma having active halogen species of atoms and molecules therein so that the gas plasma comes into contact with the wafer to remove material from the wafer by chemically reacting the material with an active halogen species in the gas plasma to form a gas-nongaseous chemical reaction which produces a halide compound.

2. A process as in claim 1 wherein said semiconductor wafer has a layer of insulating material thereon and wherein the layer of insulating material is exposed to the gas plasma to determine whether or not there are any pin holes in the layer of insulating material.

3. A process as in claim 1 wherein said semiconductor wafer is exposed to the gas plasma to clean the surface of the wafer of any impurities by chemically reacting the impurities with an active species in the gas plasma.

4. A process as in claim 1 wherein said wafer is exposed to the gas plasma to chemically polish away portions of the wafer.

5. A process as in claim 1 wherein only predetermined portions of the wafer are exposed to the gas so that only said predetermined portions are chemically attacked by the gas plasma.

6. A process as in claim 1 together with the step of forming a mask on the surface of the said wafer having a predetermined pattern, exposing portions of the wafer in accordance with the pattern and thereafter exposing the exposed portions of the wafer to the gas plasma to form recesses in the wafer in accordance with the pattern carried by the mask.

7. A method as in claim 1 wherein said semiconductor wafer is formed of silicon and has a layer of silicon dioxide thereon together with the step of depositing a layer of photoresist on the silicon dioxide, exposing the photoresist through a mask to provide a predetermined pattern on the photoresist, developing the photoresist to expose the silicon dioxide in accordance with the pattern carried by the mask, exposing the silicon dioxide to one gas plasma to remove by chemical reaction the exposed portions of silicon dioxide to thereby expose the silicon and thereafter exposing the exposed silicon to a different gas plasma to form recesses in the silicon in accordance with pattern carried by the mask.

8. A method as in claim 7 together with the step of forming semiconductor devices in the wafer and wherein the recesses in the semiconductor wafer are etched to a depth which is at least 25 percent of the thickness of the wafer.

9. A method as in claim 8 wherein said semiconductor devices have active regions extending to said surface and wherein said recesses are etched to a depth which is greater than the depth of the active regions.

10. In a process for forming scribe lines in a silicon wafer having circuit elements formed therein by a plurality of active regions extending to one surface and a layer of silicon dioxide overlying at least portions of the circuit elements, forming a mask on the layer of silicon dioxide which has scribe lines formed therein to expose the silicon dioxide, exposing the silicon dioxide to a gas plasma having active species of atoms and molecules therein to remove the exposed silicon dioxide by a chemical reaction between the silicon dioxide and a active species in the gas plasma and to thereby expose the silicon lying beneath the same and utilizing a different gas plasma having active species of atoms and molecules therein to attack the exposed silicon to provide recesses in the silicon by a chemical reaction between the silicon and an active species in the different gas plasma.

11. A process as in claim 10 wherein the recesses in the silicon are etched to a depth which is below the active regions in the semiconductor wafer.

12. A process as in claim 10 together with the step of mechanically stressing the wafer to cause the wafer to break along the scribe lines to form a plurality of dice.

13. A process as in claim 10 together with the step of forming a layer of metallization on the silicon dioxide and wherein the mask is formed on the metallization and wherein the metallization exposed through the mask is removed to expose the silicon dioxide.

14. A method as in claim 13 together with the step of forming a layer of photoresist on the metallization, exposing the photoresist through a mask to form an interconnect pattern, developing the photoresist, and removing the exposed metallization to provide the interconnect pattern.

15. A process as in claim 14 wherein said wafer is mechanically stressed to cause the wafer to break along the scribe lines to form a plurality of dice.

16. In a process for performing an operation on a wafer formed of a semiconductor material and disposed in the chamber having a pressure ranging from one-half to 10 millimeters of mercury, creating a radio frequency energy within the chamber, introducing a reactive gas containing a reactive gaseous component selected from the group consisting of chlorine and fluorine and compounds containing the same, into the chamber so that the radio frequency energy excites the reactive gas to form a gas plasma having active species of atoms and molecules therein and so that the gas plasma comes into contact with the wafer and to react chemically with the material forming the wafer.

17. A process as in claim 16 wherein said wafer is formed of a semiconductor material.

18. A process as in claim 6 wherein said wafer is formed of a semiconductor material and having portions thereof covered by a layer of insulating material.

19. A process as in claim 18 wherein said semiconductor material is silicon and wherein said layer of insulating material is silicon dioxide.

* * * * *